United States Patent
Hayashi et al.

(10) Patent No.: US 12,110,412 B2
(45) Date of Patent: Oct. 8, 2024

(54) CURABLE SILICONE COMPOSITION, ENCAPSULANT AND OPTICAL SEMICONDUCTOR DEVICE

(71) Applicant: DuPont Toray Specialty Materials Kabushiki Kaisha, Tokyo (JP)

(72) Inventors: Akito Hayashi, Chiba (JP); Sawako Horie, Chiba (JP)

(73) Assignee: DuPont Toray Specialty Materials Kabushiki Kaisha, Tokyo (JP)

( * ) Notice: Subject to any disclaimer, the term of this patent is extended or adjusted under 35 U.S.C. 154(b) by 256 days.

(21) Appl. No.: 17/387,573

(22) Filed: Jul. 28, 2021

(65) Prior Publication Data

US 2022/0064380 A1    Mar. 3, 2022

(30) Foreign Application Priority Data

Aug. 28, 2020    (JP) ................. 2020-144458

(51) Int. Cl.
| | | |
|---|---|---|
| C09D 183/04 | (2006.01) | |
| C08G 77/08 | (2006.01) | |
| C08G 77/12 | (2006.01) | |
| H01L 23/29 | (2006.01) | |
| H01L 33/56 | (2010.01) | |

(52) U.S. Cl.
CPC .......... *C09D 183/04* (2013.01); *C08G 77/08* (2013.01); *C08G 77/12* (2013.01); *H01L 23/296* (2013.01); *H01L 33/56* (2013.01); *C08L 2203/206* (2013.01); *C08L 2205/025* (2013.01)

(58) Field of Classification Search
CPC ......... C08G 77/12; C08G 77/20; C08L 83/04; B01J 23/40; H01L 33/56
See application file for complete search history.

(56) References Cited

U.S. PATENT DOCUMENTS

| | | | |
|---|---|---|---|
| 7,282,270 B2 | 10/2007 | Morita et al. | |
| 8,440,776 B2 | 5/2013 | Kashiwagi et al. | |
| 2016/0280918 A1* | 9/2016 | Kumar | H01L 33/56 |
| 2017/0283614 A1* | 10/2017 | Mochizuki | C08L 83/04 |
| 2021/0095126 A1 | 4/2021 | Mochizuki | |

FOREIGN PATENT DOCUMENTS

| | | | | |
|---|---|---|---|---|
| EP | 420585 A | * | 4/1991 | .............. C08L 83/04 |
| EP | 1035161 A2 | * | 9/2013 | |
| JP | 2004143361 A | | 5/2004 | |
| JP | 2006299099 A | | 11/2006 | |
| JP | 2006324596 A | | 11/2006 | |
| JP | 2006328102 A | | 12/2006 | |
| JP | 2010013503 | | 1/2010 | |
| WO | 2010004932 | * | 1/2010 | |
| WO | 2019157027 | | 8/2019 | |
| WO | 2019240122 | | 12/2019 | |

OTHER PUBLICATIONS

English language abstract for JP 2004-143361 A extracted from espacenet.com database on Aug. 2, 2021, 2 pages.
English language abstract and machine-assisted English translation for JP 2006-299099 A extracted from espacenet.com database on Aug. 2, 2021, 15 pages.
English language abstract and machine-assisted English translation for JP 2006-324596 A extracted from espacenet.com database on Aug. 2, 2021, 11 pages.
English language abstract for JP 2006-328102 A extracted from espacenet.com database on Aug. 2, 2021, 1 page.
English language abstract and machine-assisted English translation for JP 2010-013503 A extracted from espacenet.com database on Jun. 13, 2024, 15 pages.

* cited by examiner

*Primary Examiner* — Marc S Zimmer
(74) *Attorney, Agent, or Firm* — Howard & Howard Attorneys PLLC

(57) ABSTRACT

A curable silicone composition is capable of forming a cured product having excellent elongation characteristics.
The curable silicone composition, comprises: (A) a resinous alkenyl group-containing organopolysiloxane containing less than two alkenyl groups per molecule on average, which is represented by average unit formula (I):
$(R^1_3SiO_{1/2})_a(R^1_2SiO_{2/2})_b(R^1SiO_{3/2})_c(SiO_{4/2})_d(XO_{1/2})_e$,
where in formula (I), each $R^1$ is independently a monovalent hydrocarbon group including an alkenyl group, while the number of alkenyl groups per molecule is less than two on average, X is a hydrogen atom or an alkyl group, $0 \leq a \leq 1$, $0 \leq b \leq 1$, $0 \leq c < 0.9$, $0 \leq d < 0.5$, $0 \leq e < 0.4$, $a+b+c+d=1.0$, and $c+d>0$; (B) an organohydrogenpolysiloxane having two or more silicon atom-bonded hydrogen atoms per molecule; and (C) a curing reaction catalyst.

15 Claims, No Drawings

CURABLE SILICONE COMPOSITION, ENCAPSULANT AND OPTICAL SEMICONDUCTOR DEVICE

CROSS-REFERENCE TO RELATED APPLICATIONS

The present application claims priority to and all the benefits of Japanese Application No. 2020-144458 filed on Aug. 28, 2020, which is hereby expressly incorporated herein by reference in its entirety.

DESCRIPTION

Technical Field

The present disclosure relates to a curable silicone composition, and more specifically relates to a curable silicone composition that is suitable for use in encapsulants for optical semiconductors. The present disclosure also relates to an encapsulant comprising a cured product of the curable silicone composition, and an optical semiconductor device sealed with said encapsulant.

Background Art

When curable silicone compositions are cured, they form cured products having excellent heat resistance, weather resistance, and transparency, and are therefore widely used as optical materials.

For example, patent document 1 describes a curable organopolysiloxane composition comprising: (A) a linear organopolysiloxane having in one molecule, at least two silicon atom-bonded alkenyl groups and at least one silicon atom-bonded aryl group; (B) a branched organopolysiloxane (in an amount such that the ratio of the content of component (B) with respect to component (A) is 1/99 to 99/1 in terms of a weight unit) which has in one molecule, at least one silicon atom-bonded alkenyl group and at least one silicon atom-bonded aryl group and is represented by general formula: $RSiO_{3/2}$ (in the formula, R is an optionally substituted monovalent hydrocarbon group); (C) an organopolysiloxane having in one molecule, at least two silicon atom-bonded hydrogen atoms (1 to 200 parts by weight with respect to 100 parts by weight of the total amount of component (A) and component (B)); and (D) a hydrosilylation catalyst (in an amount that accelerates curing of the composition).

In addition, patent document 2 describes an addition curing-type silicone resin composition comprising, as essential components: (A) an organosilicon compound having in one molecule, two or more non-covalent bonding double bond groups, which contains an organopolysiloxane represented by the following average formulation formula (1): $(R^1SiO_{3/2})_a(R^2R^3SiO)_b(R^4R^5R^6SiO_{1/2})_c(SiO_{4/2})_d$ (1) (in the formula, $R^1$ to $R^6$ each represent the same or different monovalent hydrocarbon groups, 1 to 50 mol % of the total monovalent hydrocarbon groups is a non-covalent bonding double bond-containing group, and a, b, c and d are each a positive number showing the molar ratio of the respective siloxane units, where $a/(a+b+c+d)=0.40\sim0.95$, $b/(a+b+c+d)=0.05\sim0.60$, $c/(a+b+c+d)=0\sim0.05$, $d/(a+b+c+d)=0\sim0.10$, $a+b+c+d=1.0$) in an amount of 30 to 100 mass % of the total of component (A); (B) an organohydrogenpolysiloxane having in one molecule, two or more hydrogen atoms bonded to a silicon atom; and (C) a catalytic amount of platinum-based catalyst, wherein the organopolysiloxanes of component (A) and component (B) are free from silanol.

In addition, patent document 3 describes a silicone resin lens for LEDs, comprising a silicone resin in which the ratio of refractive index measured at 400 nm and 596 nm is 1.01 or greater, and the refractive index measured at 400 nm is 1.50 or greater.

In addition, patent document 4 describes a silicone resin composition for molding lens, which comprises, as essential components, (A) an organopolysiloxane having a viscosity at 25° C. of 100 mPa·s or more, which has in one molecule, two or more aliphatic unsaturated bonds, (B) an organohydrogenpolysiloxane having, in one molecule, three or more silicon atom-bonded hydrogen atoms, and (C) a platinum group metal-based catalyst, and the cured product of which is colorless and transparent.

However, a conventional resinous crosslinking agent-containing curable silicone composition which has, in one molecule, three or more silicon atom-bonded hydrogen atoms has a problem in that the elongation characteristics of the cured product are insufficient.

PRIOR ART DOCUMENTS

Patent Documents

[Patent document 1] Japanese Unexamined Patent Publication No. 2004-143361
[Patent document 2] Japanese Unexamined Patent Publication No. 2006-299099
[Patent document 3] Japanese Unexamined Patent Publication No. 2006-324596
[Patent document 4] Japanese Unexamined Patent Publication No. 2006-328102

SUMMARY OF THE INVENTION

Problems to be Solved by the Invention

An object of the present disclosure is to provide a curable silicone composition that is capable of forming a cured product that has more superior elongation characteristics. Another object of the present disclosure is to provide an encapsulant including the curable silicone composition of the present disclosure. Yet another object of the present disclosure is to provide an optical semiconductor device that is sealed with the encapsulant of the present disclosure.

Means for Solving the Problems

In order to solve the abovementioned problems, the present inventors carried out extensive studies, and as a result, surprisingly, they have discovered that with a curable silicone composition containing a combination of a resinous alkenyl group-containing organopolysiloxane including less than two alkenyl groups per molecule on average and an organohydrogenpolysiloxane having in one molecule, at least two silicon atom-bonded hydrogen atoms, it is possible to form a silicone cured product having excellent elongation characteristics, and hence they arrived at the present disclosure.

Thus, the present disclosure thus relates to a curable silicone composition, comprising: (A) a resinous alkenyl group-containing organopolysiloxane containing less than two alkenyl groups per molecule on average, which is represented by average unit formula (I): $(R^1{}_3SiO_{1/2})_a(R^1{}_2SiO_{2/2})_b(R^1SiO_{3/2})_c(SiO_{4/2})_d(XO_{1/2})_e$, where in formula (I), $R^1$ are each independently a monovalent hydrocarbon group including an alkenyl group, while the number of alkenyl groups per molecule is less than two on average, X is a hydrogen atom or an alkyl group, $0 \leq a \leq 1$, $0 \leq b \leq 1$, $0 \leq c < 0.9$, $0 \leq d < 0.5$, $0 \leq e < 0.4$, $a+b+c+d=1.0$, and $c+d>0$; (B) an organohydrogenpolysiloxane having at least two silicon atom-bonded hydrogen atoms per molecule; and (C) a curing reaction catalyst.

The organohydrogenpolysiloxane of component (B) preferably includes three or more silicon atom-bonded hydrogen atoms per molecule.

The curable silicone composition of the present disclosure preferably further includes a linear organopolysiloxane as component (D) which is different from components (A) and (B).

In the organopolysiloxane components included in the curable silicone composition of the present disclosure, the mass ratio of the resinous organopolysiloxane and linear organopolysiloxane is preferably 9:1 to 1:9.

The present disclosure also relates to an encapsulant comprising the curable silicone composition according to the present disclosure.

The present disclosure also relates to an optical semiconductor device that is equipped with the encapsulant according to the present disclosure.

Effects of the Invention

With the curable silicone composition according to the present disclosure, a cured product having excellent elongation characteristics can be formed. Also, the encapsulant according to the present disclosure comprises the curable silicone composition of the present disclosure and thus allows an optical semiconductor to be sealed with a cured product that has excellent elongation characteristics. In addition, since the optical semiconductor device of the present disclosure is sealed with the encapsulant having excellent elongation characteristics, excellent reliability is achieved.

MODE FOR CARRYING OUT THE INVENTION

Curable Silicone Composition

The curable silicone composition according to the present disclosure comprises: (A) a resinous alkenyl group-containing organopolysiloxane containing less than two alkenyl groups per molecule on average, which is represented by average unit formula (I): $(R^1_3SiO_{1/2})_a(R^1_2SiO_{2/2})_b(R^1SiO_{3/2})_c(SiO_{4/2})_d(XO_{1/2})_e$, where in formula (I), $R^1$ are each independently a monovalent hydrocarbon group including an alkenyl group, while the number of alkenyl groups per molecule is less than two on average, X is a hydrogen atom or an alkyl group, $0 \leq a \leq 1$, $0 \leq b \leq 1$, $0 \leq c < 0.9$, $0 \leq d < 0.5$, $0 \leq e < 0.4$, $a+b+c+d=1.0$, and $c+d>0$; (B) an organohydrogenpolysiloxane having at least two silicon atom-bonded hydrogen atoms per molecule; and (C) a curing reaction catalyst.

The components of the curable silicone composition of the present disclosure are described in detail below.

(A) Resinous Alkenyl Group-Containing Organopolysiloxane

Component (A) is a resinous alkenyl group-containing organopolysiloxane containing less than two alkenyl groups on average per molecule and is represented by the following average unit formula (I):

average unit formula (I): $(R^1_3SiO_{1/2})_a(R^1_2SiO_{2/2})_b(R^1SO_{3/2})_c(SiO_{4/2})_d(XO_{1/2})_e$ (in formula (I), $R^1$ are each independently a monovalent hydrocarbon group including an alkenyl group, while the number of alkenyl groups per molecule is less than two on average, X is a hydrogen atom or an alkyl group, $0 \leq a \leq 1$, $0 \leq b \leq 1$, $0 \leq c < 0.95$, $0 \leq d < 0.5$, $0 \leq e < 0.4$, $a+b+c+d=1.0$, and $c+d>0$). The curable silicone composition according to the present disclosure may comprise one type of resinous alkenyl group-containing organopolysiloxane containing less than two alkenyl groups in one molecule on average, or may comprise two or more types of resinous alkenyl group-containing organopolysiloxane containing less than two alkenyl groups in one molecule on average.

In the present specification, 'resinous organopolysiloxanes' refers to organopolysiloxanes that have a branched molecular structure or a 3D network structure. In one embodiment, the molecular structure of the resinous alkenyl group-containing organopolysiloxane of component (A) contains at least one siloxane unit (unit T) represented by $RSiO_{3/2}$ and/or siloxane unit (unit Q) represented by $SiO_{4/2}$. In one embodiment, the resinous alkenyl group-containing organopolysiloxane of component (A) contains unit T in the molecular structure thereof and may or may not contain, but preferably does not contain unit Q.

The alkenyl group-containing resinous organopolysiloxane containing less than two alkenyl groups in one molecule on average which is represented by formula (I) of component (A) preferably contains an alkenyl group in the molecular terminal, but may include the same in the unit D and/or unit T.

In formula (I) of component (A), examples of the monovalent hydrocarbon groups of $R^1$ include: C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; C2-12 alkenyl groups such as vinyl, allyl, butenyl, pentenyl, hexenyl, heptenyl, octenyl, nonenyl, decenyl, undecenyl, and dodecenyl groups; and any of these groups in which some or all of the hydrogen atoms are substituted with halogen atoms such as fluorine, chlorine, and bromine atoms. $R^1$ is preferably selected from among C1-6 alkyl groups, preferably a methyl group, C6-10 aryl groups, preferably a phenyl group, or C2-6 alkenyl groups, preferably a vinyl group.

X in formula (I) of component (A) is a hydrogen atom or an alkyl group. Preferred examples of the alkyl group represented by X include C1-3 alkyl groups, specifically, methyl, ethyl, and propyl groups.

In formula (I) of component (A), a is preferably in the range of $0.05 \leq a \leq 0.8$, more preferably in the range of $0.1 \leq a \leq 0.6$, even more preferably in the range of $0.15 \leq a \leq 0.4$. In formula (I) of component (A), b is preferably in the range of $0 \leq b \leq 0.9$, more preferably in the range of $0 \leq b \leq 0.7$, and particularly in the range of $0 \leq b \leq 0.5$. In formula (I) of component (A), c is preferably in the range of $0.1 \leq c \leq 0.9$, more preferably in the range of $0.3 \leq c \leq 0.85$, and particularly in the range of $0.5 \leq c \leq 0.8$. In formula (I) of component (A), d is preferably in the range of $0 \leq d \leq 0.5$, more preferably in the range of $0 \leq d \leq 0.3$, even more preferably in the range of $0 \leq d \leq 0.1$. In formula (I), e is preferably in the range of $0 \leq e \leq 0.15$, more preferably in the range of $0 \leq e \leq 0.1$, and particularly in the range of $0 \leq e \leq 0.05$.

The resinous alkenyl group-containing organopolysiloxane represented by formula (I) of component (A) has less than two alkenyl groups per molecule on average, preferably 1.9 or less alkenyl groups per molecule on average, more preferably 1.8 or less alkenyl groups per molecule on average. In addition, the resinous alkenyl group-containing organopolysiloxane of component (A) has, normally, one or more alkenyl groups per molecule on average, preferably 1.1 or more alkenyl groups per molecule on average, more preferably 1.2 or more alkenyl groups per molecule on average.

The average number of alkenyl groups included in the resinous alkenyl group-containing organopolysiloxane of component (A) is obtained by averaging the number of alkenyl groups per molecule included in the resinous alkenyl group-containing organopolysiloxane represented by formula (I) based on the total number of molecules. The number of alkenyl groups can be determined by means of analysis such as Fourier transform infrared spectrophotometry (FT-IR) or nuclear magnetic resonance (NMR), or by means of a titration method described below.

A method for determining the alkenyl group amount in the components by means of titration will be described. The alkenyl group content in the organopolysiloxane components can be accurately quantified by means of a titration method generally known as the Wijs method. The principle will be described below. Firstly, alkenyl groups in the organopolysiloxane starting material and iodine monochloride are subjected to an addition reaction as shown in formula (1). Next, according to the reaction shown in formula (2), an excess amount of iodine monochloride is reacted with potassium iodide, thereby freeing iodine. The freed iodine is subjected to titration with a sodium thiosulfate solution.

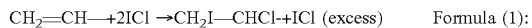

$$CH_2=CH-+2ICl \rightarrow CH_2I-CHCl-+ICl \text{ (excess)} \quad \text{Formula (1)}:$$

$$ICl+KI \rightarrow I_2+KCl \quad \text{Formula(2)}:$$

The alkenyl group amount in the component can be quantified from the difference between the amount of sodium thiosulfate required for titration and the titration amount of the blank solution prepared separately.

In addition, when the average unit formula in the design of the organopolysiloxane is apparent, it is also possible to calculate the alkenyl amount in the organopolysiloxane components from this average unit formula.

The method for calculating the average number of alkenyl groups per molecule will be explained. The number of alkenyl groups per molecule can be calculated by regarding the alkenyl groups as vinyl groups. When the average unit formula in the design of the organopolysiloxane is apparent, the value can be calculated from the theoretical value of the vinyl group equivalent amount calculated from the average unit formula and the actual measurement value of the number average molecular weight (Mn) obtained by means of GPC measurement.

Number of alkenyl groups (vinyl groups) per molecule=number average molecular weight (actual measurement value)/vinyl group equivalent amount in the designed structure.

In addition, when the average unit formula in the design of the organopolysiloxane is not apparent, the value can be calculated from the alkenyl amount included in a given amount determined by means of the abovementioned measurement method and the actual measurement value of the number average molecular weight (Mn) obtained by means of GPC measurement.

The molecular weight of organopolysiloxane of component (A) is not particularly limited, but for example, the number average molecular weight (Mn) in terms of standard polystyrene is 500 or more, preferably 1000 or more, and also preferably 100,000 or less, more preferably 10,000 or less, even more preferably 5,000 or less. The number average molecular weight (Mn) can be measured by means of GPC, for example.

In one embodiment, the resinous alkenyl group-containing organopolysiloxane represented by formula (I) of component (A) includes an aryl group in the silicon atom-bonded functional group $R^1$. The proportion of aryl groups in all silicon atom-bonded functional groups $R^1$ of organopolysiloxane of component (A) is not particularly limited, and for example, is 5 mol % or more, preferably 10 mol % or more, more preferably 15 mol % or more, even more preferably 20 mol % or more, particularly preferably 25 mol % or more. In addition, the proportion of aryl groups in all silicon atom-bonded functional groups $R^1$ of the organopolysiloxane of component (A) is, for example, 65 mol % or more, preferably 60 mol % or less, even more preferably 55 mol % or less. The proportion of aryl groups in all silicon atom-bonded functional groups can be determined by analysis such as Fourier transform infrared spectrophotometry (FT-IR) or nuclear magnetic resonance (NMR).

When the resinous alkenyl group-containing organopolysiloxane represented by formula (I) of component (A) includes aryl groups in the silicon atom-bonded functional groups $R^1$, preferably, the aryl groups are included in the siloxane unit (unit T) represented by $SiO_{3/2}$. Unit M and/or unit D may contain aryl groups but preferably do not contain aryl groups.

The amount of the resinous alkenyl group-containing organopolysiloxane represented by formula (I) of component (A) is not particularly limited, but it is included in an amount of preferably 10 mass % or more, more preferably 12 mass % or more, even more preferably 14 mass % or more, most preferably 16 mass % or more, particularly preferably 18 mass % or more, based on the total mass of the whole organopolysiloxane components. In addition, the resinous alkenyl group-containing organopolysiloxane represented by formula (I) of component (A) is, for example, included in an amount of 90 mass % or less, preferably 80 mass % or less, more preferably 70 mass % or less, even more preferably 60 mass % or less, based on the total mass of the whole organopolysiloxane components.

(B) Organohydrogenpolysiloxane

The curable silicone composition of the present disclosure contains, as a crosslinking agent, an organohydrogenpolysiloxane having two or more silicon atom-bonded hydrogen atoms per molecule of component (B). One type of organohydrogenpolysiloxane alone or a combination of 2 or more types of organohydrogenpolysiloxane may be used as component (B).

Examples of the molecular structure of the organohydrogenpolysiloxane of component (B) include a linear structure, a linear structure partially having a branched structure, a resinous form and a cyclic structure. The molecular structure of the organohydrogenpolysiloxane of component (B) is preferably a linear structure or a branched structure, even more preferably a branched structure. The organohydrogenpolysiloxane of component (B) preferably includes in the molecular structure thereof, at least one siloxane unit (unit T) represented by $RSiO_{3/2}$ and/or siloxane unit (unit Q) represented by $SiO_{4/2}$. In one embodiment, the organohydrogenpolysiloxane of component (B) includes in the molecular structure thereof unit T and optionally includes unit Q, but it is preferably free from unit Q. One structure of organohydrogenpolysiloxane alone or a combination of 2 or more structures of organohydrogenpolysiloxane may be used as component (B).

The silicon atom-bonded hydrogen atoms of component (B) may be included at both ends of the molecular chain or in side chains other than both ends of the molecular chain. Examples of a group that bonds to a silicon atom other than the hydrogen atom in component (B) include monovalent hydrocarbon groups excluding alkenyl groups, and specific examples include C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and any of these groups in which some or all of the hydrogen atoms are substituted with halogen atoms such as fluorine, chlorine, and bromine atoms. The silicon atoms in component (B) may also have a small amount of hydroxyl groups or alkoxy groups such as methoxy or ethoxy groups, provided that this does not adversely affect the aim of the present disclosure.

The organohydrogenpolysiloxane of component (B) preferably has a silicon atom-bonded hydrogen atom in the molecular terminal. The organohydrogenpolysiloxane of component (B) preferably has a silicon atom-bonded hydrogen atom in the siloxane unit (unit M) represented by $SiO_{1/2}$ and optionally has a silicon atom-bonded hydrogen atom in unit D and/or unit T, but unit D and unit T are preferably free from the silicon atom-bonded hydrogen atom.

Examples of component (B) include dimethylpolysiloxane capped at both ends of the molecular chain with dimethylhydrogensiloxy groups, dimethylsiloxane-methylphenylsiloxane copolymers capped at both ends of the molecular chain with dimethylhydrogensiloxy groups, dimethylsiloxane-methylhydrogensiloxane copolymers capped at both ends of the molecular chain with dimethylhydrogensiloxy groups, methylhydrogenpolysiloxane capped at both ends of the molecular chain with trimethylsiloxy groups, dimethylsiloxane-methylhydrogensiloxane copolymers capped at both ends of the molecular chain with trimethylsiloxy groups, organopolysiloxanes comprising $H(CH_3)_2SiO_{1/2}$ units and $SiO_{4/2}$ units, and organopolysiloxanes comprising $H(CH_3)_2SiO_{1/2}$ units, $(CH_3)_3SiO_{1/2}$ units and $SiO_{4/2}$ units.

In a preferred embodiment of the present disclosure, the organohydrogenpolysiloxane of component (B) includes three or more silicon atom-bonded hydrogen atoms per molecule on average, more preferably 3.5 or more silicon atom-bonded hydrogen atoms per molecule on average, even more preferably 4 or more silicon atom-bonded hydrogen atoms per molecule on average. Examples of this kind of component (B) include tris(dimethylhydrogensiloxy)methylsilane, tris(dimethylhydrogensiloxy)phenylsilane, compolymers comprising $H(CH_3)_2SiO_{1/2}$ units and $SiO_{4/2}$ units, copolymers comprising $H(CH_3)_2SiO_{1/2}$ units, $SiO_{4/2}$ units and $(C_6H_5)SiO_{3/2}$ units, copolymers comprising $H(CH_3)_2SiO_{1/2}$ units and $(C_6H_5)SiO_{3/2}$ units, and the like.

In one embodiment, the organohydrogenpolysiloxane of component (B) includes aryl groups in the silicon atom-bonded functional groups. The amount of aryl groups in the total silicon atom-bonded functional groups of organohydrogenpolysiloxane of component (B) is not particularly limited, but is for example, 2 mol % or more, preferably 5 mol % or more, more preferably 10 mol % or more, even more preferably 15 mol % or more. In addition, the amount of aryl groups in the total silicon atom-bonded functional groups of organohydrogenpolysiloxane of component (B) is, for example, 40 mol % or less, preferably 30 mol % or less, even more preferably 25 mol % or less.

When the organohydrogenpolysiloxane of component (B) includes aryl groups in the silicon atom-bonded functional groups, preferably, the aryl groups are included in the siloxane unit (unit T) represented by $SiO_{3/2}$. Unit M and/or unit D may contain aryl groups but preferably do not contain aryl groups.

The content of component (B) is not particularly limited but can, for example, be an amount resulting in 0.1 to 10 mols, preferably 0.5 to 5 mols, and particularly 0.8 to 2.0 mols of silicon atom-bonded hydrogen atoms in the component per 1 mol of silicon atom-bonded alkenyl groups in the curable silicone composition. It should be noted that the content of silicon-atom bonded hydrogen atoms in component (B) can be determined, for example, by analysis such as Fourier transform infrared spectrophotometry (FT-IR), nuclear magnetic resonance (NMR), etc.

In addition, in regard to the average number of silicon atom-bonded hydrogen atoms included per molecule, when the average unit formula in the design of the organopolysiloxane is apparent, the silicon atom-bonded hydrogen atoms in the organopolysiloxane components can be calculated from this average unit formula. The method of calculating the average number of silicon atom-bonded hydrogen atoms per molecule will be described. When the average unit formula in the design of the organopolysiloxane is apparent, the number of silicon atom-bonded hydrogen atoms per molecule can be calculated from the theoretical value of the silicon atom-bonded hydrogen atom equivalent amount calculated from the average unit formula and the actual measurement value of the number average molecular weight (Mn) obtained by means of GPC measurement.

Number of silicon atom-bonded hydrogen atoms per molecule=number average molecular weight (actual measurement value)/silicon atom-bonded hydrogen atom equivalent of the designed structure In addition, when the average unit formula in the design of the organopolysiloxane is not apparent, the value can be calculated from the amount of silicon atom-bonded hydrogen atoms included in a given amount which is determined by analysis such as Fourier transform infrared spectrophotometry (FT-IR) or nuclear magnetic resonance (NMR), and the actual measurement value of the number average molecular weight (Mn) obtained by means of GPC measurement.

According to another embodiment, the content of component (B) is preferably 1 mass % or more, more preferably 5 mass % or more, even more preferably 8 mass % or more, particularly preferably 10 mass % or more, based on the total mass of the whole organopolysiloxane components. In addition, the organohydrogenpolysiloxane of component (B) is, for example, included in an amount of 50 mass % or less, preferably 40 mass % or less, more preferably 35 mass % or less, even more preferably 30 mass % or less, based on the total mass of the whole organohydrogenpolysiloxane components.

(C) Curing Reaction Catalyst

The curable silicone composition of the present disclosure includes, as component (C), a curing reaction catalyst for curing the organopolysiloxane components. The curable silicone composition according to the present disclosure may contain one kind of curing reaction catalyst (C), or two or more kinds of curing reaction catalyst (C) may be used.

The curing catalyst, namely component (C), is a hydrosilylation reaction catalyst for accelerating the curing of hydrosilylation reaction-curable type silicone compositions. Examples of component (C) are, for example, platinum-based catalysts such as chloroplatinic acid, alcohol solution of chloroplatinic acid, platinum-olefin complex, platinum-1,3-divinyl-1,1,3,3-tetramethyldisiloxane complex, and platinum-supporting powder; palladium-based catalysts such as tetrakis(triphenylphosphine)palladium, and mixtures of triphenylphosphine and palladium black; and furthermore rhodium-based catalysts; platinum-based catalysts are particularly preferred.

The blended amount of component (C) is a catalytic amount that is needed to cure the curable silicone composition of the present disclosure, and is not particularly limited, but when a platinum-based catalyst is used, for example, the amount of platinum metal contained in the platinum-based catalyst is preferably in the range of 0.01 to 1000 ppm for practical purposes, particularly preferably in the range of 0.1 to 500 ppm, by weight unit, in the silicone composition.

(D) Other Organopolysiloxane Components

The curable silicone composition according to the present disclosure may also include other organopolysiloxane components as component (D), in addition to the abovementioned components (A) and (B). Examples of the molecular structure of the organopolysiloxane of component (D) are linear, linear with some branching, branched, cyclic, resinous, and 3D network structures. Component (D) can be one type of organopolysiloxane having such a molecular structure, or a mixture of 2 or more types of organopolysiloxanes having such a molecular structure.

According to one embodiment, component (D) of the present disclosure may include a linear organopolysiloxane represented by general formula (II): $R^1_3SiO(R^1_2SiO)_mSiR^1_3$ (in the formula, $R^1$ are each independently a monovalent hydrocarbon group, m is an integer of from 5 to 1000.)

In formula (II), examples of the monovalent hydrocarbon groups of $R^1$ include the same examples mentioned above for $R^1$ of formula (I) which are, for example: C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; C2-12 alkenyl groups such as vinyl, allyl, butenyl, pentenyl, hexenyl, heptenyl, octenyl, nonenyl, decenyl, undecenyl, and dodecenyl groups; and any of these groups in which some or all of the hydrogen atoms are substituted with halogen atoms such as fluorine, chlorine, and bromine atoms. $R^1$ is preferably selected from among C1-6 alkyl groups, preferably a methyl group, or C2-6 alkenyl groups, preferably a vinyl group.

In formula (II), m is preferably an integer of from 5 to 500, is more preferably an integer of from 10 to 300, and even more preferably an integer of from 15 to 150.

According to one embodiment, at least two $R^1$ per molecule may be an alkenyl group in the linear organopolysiloxane of component (D) represented by formula (II). According to a preferred embodiment, the linear organopolysiloxane of component (D) represented by formula (II) may be a linear organopolysiloxane that has alkenyl groups in both molecular terminals in which both molecular terminals are capped with alkenyl groups. Preferably, the linear organopolysiloxane of component (D) represented by formula (II) optionally has an alkenyl group in the siloxane unit (unit D) represented by $SiO_{2/2}$, but it is preferably free from alkenyl groups.

When the linear organopolysiloxane of component (D) represented by formula (II) includes alkenyl groups in the silicon atom-bonded functional groups $R^1$, the amount of alkenyl groups in the whole silicon atom-bonded functional groups is not particularly limited, and, for example, it is 0.3 mol % or more, preferably 0.5 mol % or more, more preferably 0.8 mol % or more, even more preferably 1 mol % or more. In addition, the amount of alkenyl groups in the whole silicon atom-bonded functional groups of the linear organopolysiloxane of component (D) represented by formula (II) is, for example, 20 mol % or less, preferably 15 mol % or less, even more preferably 10 mol % or less.

Further, according to another embodiment, the linear organopolysiloxane of component (D) represented by formula (II) includes an aryl group in the silicon atom-bonded functional groups $R^1$. The amount of aryl groups in all silicon atom-bonded functional groups $R^1$ of linear organopolysiloxane of component (D) represented by formula (II) is not particularly limited, and, for example, it is 2 mol % or more, preferably 5 mol % or more, more preferably 10 mol % or more, even more preferably 15 mol % or more. In addition, the amount of aryl group in the whole silicon atom-bonded functional groups of the linear organopolysiloxane of component (D) represented by formula (II) is, for example, 55 mol % or less, preferably 50 mol % or less, even more preferably 45 mol % or less.

When the linear organopolysiloxane of component (D) represented by formula (II) includes aryl groups in the silicon atom-bonded functional groups, the aryl groups are preferably included in the siloxane unit (unit D) represented by $SiO_{2/2}$. The unit M may contain aryl groups but preferably does not contain aryl groups.

The amount of linear organopolysiloxane of component (D) represented by formula (II) is not particularly limited, but it is included in an amount of preferably 5 mass % or more, more preferably 10 mass % or more, even more preferably 15 mass % or more, particularly preferably 20 mass % or more, based on the total mass of the whole organopolysiloxane components. In addition, the linear organopolysiloxane of component (D) represented by formula (II) is, for example, included in an amount of 80 mass % or less, preferably 75 mass % or less, more preferably 70 mass % or less, based on the total mass of the whole organopolysiloxane components.

According to one embodiment, component (D) of the present disclosure may include a cyclic organopolysiloxane represented by general formula (III): $(R^1_2SiO)_n$ (in the formula, $R^1$ are each independently a monovalent hydrocarbon group, n is an integer of from 3 to 50.)

In formula (III), examples of the monovalent hydrocarbon groups of $R^1$ include the same examples mentioned above for $R^1$ of formula (I) which are, for example: C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; C2-12 alkenyl groups such as vinyl, allyl, butenyl, pentenyl, hexenyl, heptenyl, octenyl, nonenyl, decenyl, undecenyl, and dodecenyl groups; and any of these groups in which some or all of the hydrogen atoms are substituted with halogen atoms such as fluorine, chlorine, and bromine atoms. $R^1$ is preferably selected from among C1-6 alkyl groups, preferably a methyl group, or C2-6 alkenyl groups, preferably a vinyl group.

In formula (III), n is preferably an integer of from 3 to 40, more preferably an integer of from 4 to 20.

According to one embodiment, at least two $R^1$ per molecule may be an alkenyl group in the cyclic organopolysiloxane of component (D) represented by formula (III). When the cyclic organopolysiloxane of component (D) represented by formula (III) includes alkenyl groups in the silicon atom-bonded functional groups $R^1$, the amount of alkenyl groups in the whole silicon atom-bonded functional groups is not particularly limited, and for example, it is 10 mol % or more, preferably 20 mol % or more, more preferably 30 mol % or more, even more preferably 40 mol % or more. In addition, the amount of alkenyl groups in the whole silicon atom-bonded functional groups of the cyclic organopolysiloxane of component (D) represented by formula (III) is for example, 80 mol % or less, preferably 70 mol % or less, even more preferably 60 mol % or less.

The amount of cyclic organopolysiloxane of component (D) represented by formula (III) is not particularly limited, but it is included in an amount of preferably 0.3 mass % or more, more preferably 0.5 mass % or more, even more preferably 0.8 mass % or more, particularly preferably 1 mass % or more, based on the total mass of the whole organopolysiloxane components. In addition, the cyclic organopolysiloxane of component (D) represented by formula (III) is, for example, included in an amount of 20 mass % or less, preferably 10 mass % or less, more preferably 5 mass % or less, based on the total mass of the whole organopolysiloxane components.

According to another embodiment, component (D) of the present disclosure may include an epoxy group-containing resinous organopolysiloxane represented by average unit formula (IV): $(R^2_3SiO_{1/2})_a(R^2_2SiO_{2/2})_b(R^2SiO_{3/2})_c(SiO_{4/2})_d(XO_{1/2})_e$ (in the formula, $R^2$ is the same or different optionally halogen-substituted monovalent hydrocarbon group or epoxy group-containing organic group, where at least one $R^2$ is an epoxy group-containing organic group, X is a hydrogen atom or an alkyl group, and $0 \leq a \leq 1$, $0 \leq b \leq 1$, $0 \leq c < 0.9$, $0 \leq d < 0.5$, $0 \leq e < 0.4$, $a+b+c+d=1.0$, and $c+d > 0$ are satisfied).

In formula (IV), $R^2$ is preferably selected from among C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C2-12 alkenyl groups such as vinyl, allyl, butenyl, pentenyl, hexenyl, heptenyl, octenyl, nonenyl, decenyl, undecenyl, and dodecenyl groups; and any of these groups in which some or all of the hydrogen atoms are substituted with halogen atoms such as fluorine, chlorine, and bromine atoms; and epoxy group-containing organic groups. Examples of the epoxy group-containing groups include: glycidoxy alkyl groups such as a 2-glycidoxyethyl group, a 3-glycidoxypropyl group and a 4-glycidoxybutyl group; epoxycycloalkyl alkyl groups such as a 2-(3,4-epoxycylohexyl)-ethyl group and a 3-(3,4-epoxycylohexyl)-propyl group; and epoxyalkyl groups such as a 3,4-epoxybutyl group and a 7,8-epoxyoctyl group, and a glycidoxyalkyl group is preferable and a 3-glycidoxypropyl group is particularly preferable.

In a preferred embodiment, the epoxy group-containing resinous organopolysiloxane of formula (IV) includes an alkenyl group in $R^2$, and more preferably includes an alkenyl group in $R^2$ of the $(R^2_3SiO_{1/2})$ unit. The amount of alkenyl groups in the whole silicon atom-bonded functional groups in the epoxy group-containing resinous organopolysiloxane of component (D) is not particularly limited, and is preferably 0.1 mol % or more, more preferably 1 mol % or more, even more preferably 2 mol % or more, and, for example, is 25 mol % or less, preferably 20 mol % or less, more preferably 15 mol % or less.

In a preferred embodiment, the epoxy group-containing resinous organopolysiloxane of formula (IV) includes an epoxy group-containing organic group in $R^2$ of the $(R^2_2SiO_{2/2})$ unit. The amount of epoxy group-containing organic groups in the whole silicon atom-bonded functional groups in the epoxy group-containing resinous organopolysiloxane of component (D) represented by formula (IV) is not particularly limited, and is preferably 0.1 mol % or more, more preferably 1 mol % or more, even more preferably 5 mol % or more, and, for example, is 50 mol % or less, preferably 40 mol % or less, more preferably 30 mol % or less. The amount of epoxy group-containing organic groups can be determined, for example, by analysis such as Fourier transform infrared spectrophotometry (FT-IR) or nuclear magnetic resonance (NMR).

In addition, according to another embodiment, the epoxy group-containing resinous organopolysiloxane of component (D) represented by formula (IV) includes an aryl group in the silicon atom-bonded functional group $R^2$, and preferably includes an aryl group in $R^2$ in the $(R^2SiO_{3/2})$ unit. The amount of aryl groups in all silicon atom-bonded functional groups $R^2$ of the epoxy group-containing resinous organopolysiloxane of component (D) represented by formula (IV) is not particularly limited, and, for example, is 5 mol % or more, preferably 10 mol % or more, more preferably 15 mol % or more, even more preferably 20 mol % or more. In addition, the amount of aryl groups in the whole silicon atom-bonded functional groups of the epoxy group-containing resinous organopolysiloxane of component (D) represented by formula (IV) is, for example, 60 mol % or less, preferably 50 mol % or less, even more preferably 40 mol % or less.

In formula (IV), a is preferably in the range of $0 \leq a \leq 0.8$, more preferably in the range of $0.05 \leq a \leq 0.6$, particularly in the range of $0.1 \leq a \leq 0.4$. In formula (X), b is preferably in the range of $0 \leq b \leq 0.9$, more preferably in the range of $0.1 \leq b \leq 0.7$, and particularly in the range of $0.2 \leq b \leq 0.5$. In formula (X), c is preferably in the range of $0.1 \leq c \leq 0.9$, more preferably in the range of $0.2 \leq c \leq 0.8$, and particularly in the range of $0.3 \leq c \leq 0.7$. In formula (X), d is preferably in the range of $0 \leq d \leq 0.5$, more preferably in the range of $0 \leq d \leq 0.4$, even more preferably in the range of $0 \leq d \leq 0.3$. In formula (X), e is preferably in the range of $0 \leq e \leq 0.3$, more preferably in the range of $0 \leq e \leq 0.2$, and particularly in the range of $0 \leq e \leq 0.1$.

The amount of epoxy group-containing resinous organopolysiloxane of component (D) represented by formula (IV) is not particularly limited, but it is included in an amount of preferably 0.5 mass % or more, more preferably 1 mass % or more, even more preferably 1.5 mass % or more, particularly preferably 2 mass % or more, based on the total mass of the whole organopolysiloxane components. In addition, the epoxy group-containing resinous organopolysiloxane of component (D) represented by formula (IV) is, for example, included in an amount of 20 mass % or less, preferably 10 mass % or less, more preferably 5 mass % or less, based on the total mass of the whole organopolysiloxane components.

According to a specific embodiment of the present disclosure, the curable silicone composition according to the present disclosure may include a resinous organopolysiloxane and a linear organopolysiloxane at a mass ratio of, for example, 1:9 to 9:1, preferably 1:7 to 7:1, more preferably 1:5 to 5:1. Further, according to another specific embodiment of the present disclosure, the curable silicone composition according to the present disclosure may include a resinous alkenyl group-containing organopolysiloxane and a linear alkenyl group-containing organopolysiloxane at a mass ratio of, for example, 1:9 to 9:1, preferably 1:7 to 7:1, more preferably 1:5 to 5:1.

Optional components can be blended into the curable silicone composition of the present disclosure provided that this does not adversely affect the aim of the present disclosure. Examples of optional components include, for example, acetylene compounds, organic phosphorus compounds, vinyl group-containing siloxane compounds, and hydrosilylation reaction inhibitors, curing retarders, pigments, inorganic fillers, or inorganic fillers that have undergone a surface hydrophobic treatment with an organosilicon compound, powder surface treatment agents or surfactants, organopolysiloxanes free from silicon atom-bonded hydrogen atoms and silicon atom-bonded alkenyl groups, tackifiers, releasing agents, metallic soaps, agents that impart heat resistance, agents that impart cold resistance, thermally conductive fillers, agents that impart flame retardance, agents that impart thixotropic properties, fluorescent substances, solvents, and the like.

A hydrosilylation reaction inhibitor is a component for suppressing the hydrosilylation reaction of the silicone composition, and specific examples are, for example, acetylene-based reaction inhibitors such as ethynylcyclohexanol, and amine-, carboxylic acid ester-, phosphite ester-, etc., based reaction inhibitors. The reaction inhibitor is usually added in an amount of 0.001 to 5 mass % of the total composition of the present disclosure.

Examples of curing retarders include: alkyne alcohols such as 2-methyl-3-butyn-2-ol, 3,5-dimethyl-1-hexyn-3-ol, 2-phenyl-3-butyn-2-ol, 1-ethynyl-1-cyclohexanol; enyne compounds such as 3-methyl-3-penten-1-yne and 3,5-dimethyl-3-hexen-1-yne; alkenyl group-containing low-molecular weight siloxanes such as tetramethyltetravinylcyclotetrasiloxane and tetramethyltetrahexenylcyclotetrasiloxane; and alkynyloxysilanes such as methyl-tris(1,1-dimethylpropynyloxy) silane and vinyl-tris(1,1-dimethylpropynyloxy) silane. The content of curing retarder is not limited but is preferably in the range of 10 to 10000 ppm in terms of mass units, with respect to the present composition.

Examples of pigments include silica, metal oxides such as titanium oxide, aluminium oxide, zinc oxide, zirconium oxide and magnesium oxide; hollow fillers such as glass balloons and glass beads; and others such as barium sulfate, zinc sulfate, barium titanate, aluminium nitride, boron nitride, and antimony oxide. Examples of black pigments include, for example, iron oxide, aniline black, activated carbon, graphite, carbon nanotubes, and carbon black.

Examples of inorganic fillers include, for example: metal oxide particles such as fumed silica, crystalline silica, precipitated silica, silsesquioxane, magnesium oxide, iron oxide, talc, mica, diatomaceous earth and glass beads; inorganic fillers such as aluminium hydroxide, magnesium carbonate, calcium carbonate and zinc carbonate; fibrous fillers such as glass fibres; and fillers such as these fillers that have undergone a surface hydrophobic treatment with an organosilicon compound such as an organoalkoxysilane compound, an organochlorosilane compound, an organosilazane compound, or a low molecular weight siloxane compound. In addition, silicone rubber powder, silicone resin powder and the like can also be incorporated. The inorganic filler may be blended in an amount of 40% by mass or less, preferably 30% by mass or less, more preferably 20% by mass or less, and particularly 10% by mass or less, of the composition.

The powder surface treatment agent is not particularly limited, and examples include organosilazanes, organocyclosiloxanes, organochlorosilanes, organoalkoxysilanes, low molecular weight linear siloxanes, organic compounds and the like. Herein, examples of the organic compounds include, for example, polyhydric alcohols, alkanolamines or derivatives thereof, organosilicon compounds such as organic siloxane, higher fatty acids or metal salts thereof, organometallic complexes, organometallic complexes, fluorine-based organic compounds, anionic surfactants, cationic surfactants, nonionic surfactants, and the like.

An organosilicon compound having at least one alkoxy group bonded to a silicon atom in one molecule is preferred as an adhesiveness imparting agent. Examples of the alkoxy group include a methoxy group, an ethoxy group, a propoxy group, a butoxy group and a methoxyethoxy group, and a methoxy group is particularly preferable. Examples of a group that bonds to the silicon atom other than the alkoxy group in the organosilicon compound include: an optionally halogen-substituted monovalent hydrocarbon group such as an alkyl group, an alkenyl group, an aryl group, an aralkyl group and alkyl halide groups; a glycidoxyalkyl group such as a 3-glycidoxypropyl group and a 4-glycidoxybutyl group; an epoxycylohexylalkyl group such as a 2-(3,4-epoxycyclohexyl)ethyl group and a 3-(3,4-epoxycyclohexyl)propyl group; an epoxyalkyl group such as a 3,4-epoxybutyl group and a 7,8-epoxyoctyl group; an acryl group-containing monovalent organic group such as a 3-methacryloxypropyl group; and a hydrogen atom. The organosilicon compound preferably has a group that undergoes reaction with an alkenyl group or a silicon atom-bonded hydrogen atom in the present composition, and specifically, the compound preferably has a silicon atom-bonded hydrogen atom or an alkenyl group. In addition, in view of imparting excellent adhesiveness to various base materials, this organosilicon compound preferably has at least one epoxy group-containing monovalent organic group in one molecule. Examples of this type of organosilicon compound include an organosilane compound, an organosiloxane oligomer, and an alkyl silicate. The molecular structure of the organosiloxane oligomer or alkyl silicate may be, for example, linear, linear with some branching, branched, cyclic or network structures, and in particular, linear, branched and network structures are preferred. Examples of organosilicon compounds include: a silane compound such as 3-glycidoxypropyltrimethoxysilane, 2-(3,4-epoxycyclohexyl)ethyltrimethoxysilane, and 3-methacryloxypropyltrimethoxysilane; a siloxane compound having, in one molecule, respectively at least one each of a silicon atom-bonded alkenyl group or silicon atom-bonded hydrogen atom, and a silicon atom-bonded alkoxy group; a mixture of a silane compound or siloxane compound which has at least one silicon atom-bonded alkoxy group and a siloxane compound having, in one molecule, respectively at least one each of a silicon atom-bonded hydroxy group and a silicon atom-bonded alkenyl group; methyl polysilicate; ethyl polysilicate; and epoxy group-containing ethyl polysilicate. The adhesiveness imparting agent is preferably a low-viscosity solution, and the viscosity thereof is not limited but is preferably in the range of 1 to 500 mPa·s at 25° C. In addition, the content of the adhesiveness imparting agent is not limited, but is preferably in the range of from 0.01 to 10 parts by mass with respect to 100 parts by mass of the total of the present composition.

The releasing agent is not particularly limited, and examples include, for example, a carboxylic acid-based releasing agent, an ester-based releasing agent, an ether-based releasing agent, a ketone-based releasing agent, an alcohol-based releasing agent, and the like. These may be used singly or two or more kinds may be used in combination. In addition, as the releasing agent, a substance free from silicon atoms, a substance including silicon atoms or a mixture thereof can be used. More specific examples of the releasing agent include carnauba wax, montan wax, calcium stearate, calcium montanate, magnesium stearate, magnesium montanate, zinc stearate, zinc montanate, ester-based wax, olefin-based wax, and the like.

The curable silicone composition of the present disclosure can be prepared by mixing the components. The method of mixing the components may be a conventionally known method, and is not particularly limited, and a uniform mixture is usually obtained by simple mixing. Further, when solid components such as inorganic filler are included as optional components, it is preferable to use a mixing device for the mixing. There are no particular limitations regarding this mixing device, and examples include single- and twin-screw continuous mixers, double roller mixers, Ross mixers, Hobart mixers, dental mixers, planetary mixers, kneader mixers, Henschel mixers, and the like.

Encapsulant

The present disclosure also relates to an encapsulant comprising the curable silicone composition of the present disclosure. The encapsulant of the present disclosure is an encapsulant for optical semiconductors. The shape of the encapsulant of the present disclosure is not particularly limited, but it is preferably in the form of a film or sheet. The present disclosure therefore also relates to a film obtained by solidifying the curable silicone composition of the present disclosure. The film of the present disclosure can be preferably used as an encapsulant in the form of a film for encapsulating a semiconductor element. The semiconductor to be sealed with the encapsulant or film of the present disclosure is not particularly limited, and examples include, for example, semiconductors of SiC, GaN, etc., and optical semiconductors such as light emitting diodes.

With the encapsulant or film of the present disclosure, since the curable silicone composition of the present disclosure is included, it is possible to seal an optical semiconductor with a cured product having excellent elongation characteristics, and a highly reliable optical semiconductor device can be provided.

[Optical Semiconductor Device]

The optical semiconductor device of the present disclosure comprises an optical semiconductor element that is sealed with the encapsulant of the present disclosure. In other words, an optical semiconductor element is sealed, coated, or adhered by means of the cured product of the curable silicone composition of the present disclosure. The optical semiconductor element can be, for example, a photoemitter or photodetector for a photocoupler, solid-state imaging, a phototransistor, photodiode, semiconductor laser, or light-emitting diode (LED); it is particularly preferably a light-emitting diode (LED).

Light-emitting diodes (LEDs) emit light from the upper, lower, left and right sides of the optical semiconductor element, and so it is undesirable for parts constituting the light-emitting diode (LED) to absorb light, and materials having high light transmittance or high reflectance are preferred for said parts. Consequently, the substrate on which the optical semiconductor element is mounted also preferably comprises a material of high light transmittance or high reflectance. Examples of this substrate on which the optical semiconductor element is mounted are, for example, conductive metals such as silver, gold and copper; non-conductive metals such as aluminium and nickel; thermoplastic resins mixed with white pigment, such as PPA and LCP; thermosetting resins containing white pigment, such as epoxy resin, BT resin, polyimide resin and silicone resin; and ceramics such as alumina and alumina nitride.

The optical semiconductor device of the present disclosure is sealed with the encapsulant of the present disclosure having excellent elongation characteristics and is therefore highly reliable.

EXAMPLES

The curable silicone composition of the present disclosure is described in greater detail by means of the following examples and comparative examples.

The starting material components shown below were used in the following examples and comparative examples. Below, Me denotes methyl groups, Vi denotes vinyl groups, Ph denotes phenyl groups, and Ep denotes 3-glycidoxypropyl groups.

Component (a): Resinous alkenyl group-containing organopolysiloxane

Component a-1: Resinous alkenyl group-containing organopolysiloxane having a number average molecular weight of 1600 and represented by an average unit formula: $(Me_3SiO_{1/2})_{0.13}(ViMe_2SiO_{1/2})_{0.09}(MeSiO_{3/2})_{0.39}(PhSiO_{3/2})_{0.39}$, average number of vinyl groups per molecule: 1.5

Component a-2: Resinous alkenyl group-containing organopolysiloxane having a number average molecular weight of 1700 and represented by an average unit formula: $(Me_3SiO_{1/2})_{0.15}(ViMe_2SiO_{1/2})_{0.07}(MeSiO_{3/2})_{0.39}(PhSiO_{3/2})_{0.39}$, average number of vinyl groups per molecule: 1.3

Component a-3: Resinous alkenyl group-containing organopolysiloxane having a number average molecular weight of 1200 and represented by an average unit formula: $(Me_3SiO_{1/2})_{0.07}(ViMe_2SiO_{1/2})_{0.18}(PhSiO_{3/2})_{0.75}$, average number of vinyl groups per molecule: 1.8

Component a-4: Resinous alkenyl group-containing organopolysiloxane having a number average molecular weight of 1400 and represented by an average unit formula: $(Me_3SiO_{1/2})_{0.13}(ViMe_2SiO_{1/2})_{0.09}(MeSiO_{3/2})_{0.39}(PhSiO_{3/2})_{0.39}$, average number of Vi groups per molecule: 1.3

Component a'-1: Resinous alkenyl group-containing organopolysiloxane represented by an average unit formula: $(Me_3SiO_{1/2})_{0.05}(ViMe_2SiO_{1/2})_{0.17}(MeSiO_{3/2})_{0.39}(PhSiO_{3/2})_{0.39}$, average number of vinyl group per molecule: 3.0

Component a'-2: Resinous alkenyl group-containing organopolysiloxane represented by average unit formula: $(ViMe_2SiO_{1/2})_{0.25}(PhSiO_{3/2})_{0.75}$, average number of vinyl groups per molecule: 2.5

Component b-1: Organohydrogenpolysiloxane represented by average unit formula: $(HMe_2SiO_{3/2})_{60}(PhSiO_{3/2})_{40}$, the average number of silicon atom-bonded hydrogen atoms included per molecule: 4.6

Component c: Complex of platinum having a platinum concentration of 4.0 mass % and 1,3-divinyl-1,1,3,3-tetramethyldisiloxane, in an amount of 5000 ppm (catalytic amount) with respect to 100 parts by mass of whole organopolysiloxane components.

Component d-1: Linear organopolysiloxane in which both ends of the molecular chain are capped with alkenyl groups, which is represented by general formula $ViMe_2SiO(MePhSiO)_{20}SiViMe_2$ Component d-2: Linear organopolysiloxane in which both ends of the molecular chain are capped with alkenyl groups, which is represented by general formula $ViMe_2SiO(Me_2SiO)_{60}(Ph_2SiO)_{30}SiViMe_2$ Component d-3: Alkenyl group-containing cyclic organopolysiloxane represented by general formula $(ViMeSiO)_4$ Component d-4: Epoxy group-containing resinous organopolysiloxane represented by average unit formula $(ViMe_2SiO_{1/2})_{0.18}(EpMeSiO_{2/2})_{0.29}(PhSiO_{3/2})_{0.53}$ Examples 1-4 and Comparative Examples 1-3

Curable silicone compositions were prepared by mixing the components in accordance with the formulations (% by mass) shown in Tables 1 and 2.

Evaluation

With regard to the respective compositions of the examples and comparative examples, the elongation of cured products were measured as below and the results are shown in Tables 1.

The curable silicone composition was applied in a sheet form and heated at 150° C. for 1 hour, thereby preparing a cured product in a sheet form which has a thickness of 1 mm, and this was punched into the shape of dumbbell shape No. 3 specified in JIS K 6251-1993 "Tensile test method for vulcanized rubber", and this sample was used to measure the elongation (%) at break by using an Autograph manufactured by Shimadzu Corporation.

TABLE 1

| Component | Example 1 | Example 2 | Comparative Example 1 | Example 3 | Comparative Example 2 |
|---|---|---|---|---|---|
| a-1 | 50 | — | — | — | — |
| a-2 | — | 50 | — | — | — |
| a-3 | — | — | — | 46.2 | — |
| a'-1 | — | — | 44.3 | — | — |
| a'-2 | — | — | — | — | 46.2 |
| b-1 | 17.5 | 15 | 23.2 | 25.9 | 25.9 |
| d-1 | 27.3 | 28.8 | 27.3 | 22.7 | 22.7 |
| d-3 | 2.2 | 3.2 | 2.2 | 2.2 | 2.2 |
| d-4 | 3 | 3 | 3 | 3 | 3 |
| c | Catalytic amount | Catalytic amount | Catalytic amount | Catalytic amount | Catalytic amount |
| Average number of Vi groups per molecule in component a | 1.5 | 1.3 | 3.0 | 1.8 | 2.5 |
| Elongation (%) | 37 | 37 | 10 | 30 | 12 |

TABLE 2

| Component | Example 4 | Comparative Example 3 |
|---|---|---|
| a-4 | 20 | — |
| a'-1 | — | 20 |
| b-1 | 11.2 | 11.2 |
| d-2 | 64.6 | 64.6 |
| d-3 | 1.2 | 1.2 |
| d-4 | 3 | 3 |
| c | Catalytic amount | Catalytic amount |
| Average number of Vi groups per molecule in component a | 1.3 | 3.0 |
| Elongation (%) | 57 | 31 |

As is clear from the abovementioned results, cured products obtained by curing the curable silicone compositions of examples 1 and 2 of the present disclosure showed excellent elongation characteristics.

INDUSTRIAL APPLICABILITY

The curable silicone composition of the present disclosure is particularly useful as an encapsulant for optical semiconductors, such as light emitting diodes (LEDs), semiconductor lasers, photodiodes, phototransistors, solid-state imaging, and light emitters and light receivers for photocouplers, etc.

The invention claimed is:

1. A curable silicone composition comprising:
    (A) a resinous alkenyl group-containing organopolysiloxane containing less than two alkenyl groups per molecule on average, which is represented by average unit formula (1): $(R^1_3SiO_{1/2})_a (R^1_2SiO_{2/2})_b (R^1SiO_{3/2})_c (SiO_{4/2})_d (XO_{1/2})_e$, where in formula (1), each $R^1$ is independently a monovalent hydrocarbon group, while the number of alkenyl groups per molecule is one or more and is less than two on average, X is a hydrogen atom or an alkyl group, a is $0.05 \leq a \leq 0.8$, b is $0 \leq b \leq 0.9$, c is $0.1 \leq c \leq 0.9$, d=0, e is $0 \leq e \leq 0.15$, a+b+c=d=1.0 and c+d>0;
    (B) an organohydrogenpolysiloxane having three or more silicon atom-bonded hydrogen atoms per molecule;
    (C) a curing reaction catalyst; and
    (D) an organopolysiloxane which is different from components (A) and (B).

2. The curable silicone composition as claimed in claim 1, wherein the mass ratio of the resinous organopolysiloxane and linear organopolysiloxane is 9:1 to 1:9.

3. An encapsulant comprising the curable silicone composition described in claim 1.

4. An optical semiconductor device comprising the encapsulant described in claim 3.

5. The curable silicone composition as claimed in claim 1, wherein the resinous alkenyl group-containing organopolysiloxane (A) contains an alkenyl group in its molecular terminal.

6. The curable silicone composition as claimed in claim 1, wherein the resinous alkenyl group-containing organopolysiloxane (A) has from 1 to 1.9 alkenyl groups per molecule on average.

7. The curable silicone composition as claimed in claim 1, wherein the organohydrogenpolysiloxane of component (B) is a branched structure.

8. The curable silicone composition as claimed in claim 1, wherein the organohydrogenpolysiloxane of component (B) includes at least one siloxane unit (unit T) represented by $SiO_{3/2}$ and/or siloxane unit (unit Q) represented by $SiO_{4/2}$.

9. The curable silicone composition as claimed in claim 1, wherein the organopolysiloxane of component (D) includes a linear organopolysiloxane represented by general formula (II):

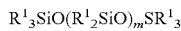

$R^1_3SiO(R^1_2SiO)_mSR^1_3$ where in formula (II), each $R^1$ is independently a monovalent hydrocarbon group, and m is an integer of from 5 to 1000.

10. A curable silicone composition comprising:
    (A) a resinous alkenyl group-containing organopolysiloxane containing less than two alkenyl groups per molecule on average, which is represented by average unit formula (I): $(R^1_3SiO_{1/2})$ a $(R^1_2SiO_{2/2})$ b $(R^1SiO_{3/2})$ c $(SiO_{4/2})$ d $(XO_{1/2})$ e, where in formula (I), each $R^1$ is independently a monovalent hydrocarbon group, while the number of alkenyl groups per molecule is one or more and is less than two on average, X is a hydrogen atom or an alkyl group, $0 \leq a \leq 1$, $0 \leq b \leq 1$, $0 \leq c < 0.9$, $d=0$, $0 \leq e < 0.4$, $a+b+c+d=1.0$, and $c+d>0$;

(B) an organohydrogenpolysiloxane having three or more silicon atom-bonded hydrogen atoms per molecule;

(C) a curing reaction catalyst; and (D) an organopolysiloxane which is different from components (A) and (B), wherein the organopolysiloxane of component (D) includes a cyclic organopolysiloxane represented by general formula (III):

$$(R^1{}_2SiO)_n,$$

where in formula (III), each $R^1$ is independently a monovalent hydrocarbon group, and n is an integer of from 3 to 50.

11. An optical semiconductor device comprising an encapsulant which comprises the curable silicone composition described in claim 10.

12. A curable silicone composition comprising:
(A) a resinous alkenyl group-containing organopolysiloxane containing less than two alkenyl groups per molecule on average, which is represented by average unit formula (I): $(R^1{}_3SiO_2)_a (R^1{}_2SiO_{2/2})_b (R^1SiO_{3/2})_c (SiO_{4/2})_d (XO_{1/2})_e$, where in formula (I), each $R^1$ is independently a monovalent hydrocarbon group, while the number of alkenyl groups per molecule is one or more and is less than two on average, X is a hydrogen atom or an alkyl group, $0 \leq a \leq 1$, $0 \leq b \leq 1$, $0 \leq c < 0.9$, $d=0$, $0 \leq e < 0.4$, $a+b+c+d=1.0$, and $c+d>0$;

(B) an organohydrogenpolysiloxane having three or more silicon atom-bonded hydrogen atoms per molecule;

(C) a curing reaction catalyst; and (D) an organopolysiloxane which is different from components (A) and (B), wherein the organopolysiloxane of component (D) includes an epoxy group-containing resinous organopolysiloxane represented by average unit formula (IV):

$$(R^2{}_3SiO_{1/2})_a (R^2{}_2SiO_{2/2})_b (R^2SiO_{3/2})_c (SiO_{4/2})_d (XO_{1/2})_e$$

where in formula (IV), each $R^2$ is the same or different optionally halogen-substituted monovalent hydrocarbon group or epoxy group-containing organic group, at least one $R^2$ is an epoxy group-containing organic group, X is a hydrogen atom or an alkyl group, and $0 \leq a \leq 1$, $0 \leq b \leq 1$, $0 \leq c < 0.9$, $0 \leq d < 0.5$, $0 \leq e < 0.4$, $a+b+c+d=1.0$, and $c+d>0$.

13. An optical semiconductor device comprising an encapsulant which comprises the curable silicone composition described in claim 12.

14. The curable silicone composition as claimed in claim 12, wherein the organopolysiloxane of component (D) further includes a linear organopolysiloxane represented by general formula (II):

$$R^1{}_3SiO(R^1{}_2SiO)_m SR^1{}_3$$

where in formula (II), each $R^1$ is independently a monovalent hydrocarbon group, and m is an integer of from 5 to 1000.

15. A curable silicone composition comprising:
(A) a resinous alkenyl group-containing organopolysiloxane containing less than two alkenyl groups per molecule on average, which is represented by average unit formula (1): $(R^1{}_3SiO_{1/2})_a (R^1{}_2SiO_{2/2})_b (R^1SiO_{3/2})_c (SiO_{4/2})_d (XO_{1/2})_e$, where in formula (1), each $R^1$ is independently a monovalent hydrocarbon group, where the number of alkenyl groups per molecule is from 1 to 1.9 alkenyl groups per molecule on average, X is a hydrogen atom or an alkyl group, a is $0 \leq a \leq 1$, b is $0 \leq b \leq 1$, c is $0 \leq c \leq 0.9$, $d=0$, e is $0 \leq e \leq 0.4$, $a+b+c=d=1.0$ and $c+d>0$;

(B) an organohydrogenpolysiloxane having three or more silicon atom-bonded hydrogen atoms per molecule;

(C) a curing reaction catalyst; and (D) an organopolysiloxane which is different from components (A) and (B).

* * * * *